US008040056B2

(12) United States Patent
Abe et al.

(10) Patent No.: US 8,040,056 B2
(45) Date of Patent: Oct. 18, 2011

(54) ORGANIC EL DISPLAY PANEL AND METHOD FOR MANUFACTURING THEREOF

(75) Inventors: Yuko Abe, Tokyo (JP); Eiichi Kitazume, Tokyo (JP); Koji Takeshita, Tokyo (JP)

(73) Assignee: Toppan Printing Co., Ltd. (JP)

( * ) Notice: Subject to any disclaimer, the term of this patent is extended or adjusted under 35 U.S.C. 154(b) by 42 days.

(21) Appl. No.: 12/429,945

(22) Filed: Apr. 24, 2009

(65) Prior Publication Data

US 2010/0079067 A1   Apr. 1, 2010

(30) Foreign Application Priority Data

Sep. 29, 2008   (JP) ................................. 2008-250859

(51) Int. Cl.
   *H01J 1/63* (2006.01)
   *H01J 63/04* (2006.01)

(52) U.S. Cl. ........ 313/506; 313/483; 313/500; 313/501; 313/504; 313/505; 313/503; 445/24; 445/25

(58) Field of Classification Search ........................ None
   See application file for complete search history.

(56) References Cited

U.S. PATENT DOCUMENTS

| | | | | |
|---|---|---|---|---|
| 7,192,535 | B2 * | 3/2007 | Takasu et al. | 252/301.16 |
| 7,285,910 | B2 * | 10/2007 | Park et al. | 313/506 |
| 2006/0273718 | A1 * | 12/2006 | Wang et al. | 313/512 |
| 2007/0210705 | A1 * | 9/2007 | Yokoi et al. | 313/506 |
| 2007/0241665 | A1 * | 10/2007 | Sakanoue et al. | 313/503 |
| 2007/0290604 | A1 * | 12/2007 | Sakanoue et al. | 313/503 |
| 2009/0108739 | A1 * | 4/2009 | Shimizu et al. | 313/504 |
| 2009/0128014 | A1 * | 5/2009 | Kitazume | 313/504 |
| 2010/0308717 | A1 * | 12/2010 | Kitazume et al. | 313/504 |

FOREIGN PATENT DOCUMENTS

JP   2004-158436   3/2004

* cited by examiner

*Primary Examiner* — Natalie K Walford
(74) *Attorney, Agent, or Firm* — Squire, Sanders & Dempsey (US) LLP

(57) ABSTRACT

An embodiment of the present invention is an organic EL display panel including a plurality of first electrodes, a confining wall which covers an edge part of the first electrode and sections the plurality of first electrodes into different pixels, a luminescent medium layer which has a plurality of layers including a luminescent layer and a second electrode formed on the luminescent medium layer, and an organic EL display panel also includes at least two layers which are included in the luminescent medium layer and which are formed into a stripe shape and are perpendicular to each other.

19 Claims, 4 Drawing Sheets

ORGANIC EL DISPLAY PANEL AND METHOD FOR MANUFACTURING THEREOF

CROSS REFERENCE TO RELATED APPLICATION

This application is based on and claims the benefit of priority from the Japanese Patent Application number 2008-250859, filed on Sep. 29, 2008; the entire contents of which are incorporated herein by reference.

BACKGROUND OF THE INVENTION

1. Field of the Invention

The present invention relates to an organic EL display panel and a method for manufacturing an organic EL display panel. In particular, the present invention relates to an organic EL display panel and a method for manufacturing an organic EL display panel in which a crosstalk can be prevented while a driving voltage is decreased and a luminescent efficiency is improved by forming a luminescent medium layer which has a plurality of layers, only within pixels.

2. Description of the Related Art

An organic EL element emits light by applying electrical current to a luminescent layer. The luminescent layer which is made of an organic luminescence material is formed between two electrodes facing each other.

In order to manufacture a reliable element efficiently, the thickness of a luminescent layer is important. When a luminescent layer is used for a color display, patterning with a high definition is necessary.

As an organic luminous material which forms a luminescent layer, a low-molecular material and a high-molecular material can be used. In general, a thin film of a low-molecular material is formed by a vacuum evaporation method or the like, and in this case, patterning is performed by using a mask which has a fine pattern. However, there was a problem that the larger a substrate became, the more difficult it becomes to obtain patterning accuracy. Moreover, throughput is poor since a film formation is carried out in a vacuum condition.

Then, recently, a method for forming a thin film by a wet coating method with a coating liquid which is made by dissolving a high-molecular material in a solvent has been practiced. A layer composition in which a hole transport layer and a luminescent layer are stacked from an anode side, i.e. a composition of two layers is usual, when a luminescent medium layer which includes a luminescent layer is formed by a wet coating method using a coating liquid of a high-molecular material. At this time, in order to provide a color panel, it is necessary to form different colors of a luminescent layer separately, using an organic luminescent ink which is made by dissolving or stably dispersing an organic luminous material having respective colors of red (R), green (G) and blue (B) in a solvent.

However, in either case that an organic luminous material of a low-molecular material or a high-molecular material is used, separated applications of materials other than a luminous material are not generally performed. Therefore, as FIG. 5 shows, a solid film as a common layer for all colors is sufficient and high definition patterning is not necessary. A film of polymer formed by a wet coating method, a film of a low-molecular organic material formed by a vacuum evaporation method and a film of an inorganic material formed by a vacuum evaporation method, sputtering, CVD (CHEMICAL VAPOR DEPOSITION) or other film formation methods can be used as a layer other than a luminescent layer. At this time, when a film of an inorganic material which has a high electrical conductivity is formed in order to decrease a driving voltage, an electrical current leaks into an adjacent pixel and a film of an inorganic material which essentially does not emit light between pixels. Therefore, there was a problem of a crosstalk in which a space between pixels and an adjacent pixel emitted light.

To solve this problem, a crosstalk can be prevented by controlling an electrical current leak by using a material which has a low electrical conductivity. However, there still remained a problem that an electrical power became large by increasing a driving voltage or by a decrease in luminescent efficiency caused by a decrease of an inlet flow of a hole from an anode. Although film resistance can be controlled by making the thickness of an inorganic material thin, it becomes easier for the EL to short out by making the thickness of an inorganic material thin. Therefore, there was a problem that the yield rate of production decreases.

According to Patent Document 1 a technique is disclosed in which a film quality is changed for controlling an electrical current leak by processing a film formed on a confining wall with UV. However, there was a problem that the above technique was mainly effective for a hole transport layer made of an organic material and processing was complicated.

As shown in FIG. 7, the hitherto known organic EL display panel has, for example, a hole transport layer made of an inorganic material and a counter electrode formed on an anode. In the above, when a film of a hole transport layer made of a hole transport material of an inorganic material is formed on a display area, a pattern formation of a film is performed by a vacuum evaporation method, sputtering or CVD. However, when a solid film of a hole transport layer made of an inorganic material which has a high electrical conductivity is formed in order to decrease a driving voltage, an electrical current leaks into an adjacent pixel and a film of a hole transport layer made of an inorganic material which essentially does not emit light between pixels. Therefore, there was a problem of a crosstalk in which a space between pixels and an adjacent pixel emitted light.

The present invention relates to an organic EL display panel which has a plurality of luminescent medium layers including a luminescent layer and a method for manufacturing an organic EL display panel. In particular, the present invention relates to an organic EL display panel and a method for manufacturing an organic EL display panel in which a crosstalk can be prevented while a driving voltage of an element is decreased and a luminescent efficiency is improved.

Patent Document 1: JP-A-2004-158436

SUMMARY OF THE INVENTION

An embodiment of the present invention is an organic EL display panel including a plurality of first electrodes, a confining wall which covers an edge part of the first electrode and sections the plurality of first electrodes into different pixels, a luminescent medium layer which has a plurality of layers including a luminescent layer and a second electrode formed on the luminescent medium layer, and the organic EL display panel also includes at least two layers which are included in the luminescent medium layer and which are formed into a stripe shape and are perpendicular to each other.

1 . . . a hole transport layer, 2 . . . a luminescent layer, 3 . . . a counter electrode layer, 4 . . . a luminescent medium layer, 5 . . . a support medium, 6 . . . an active layer, 7 . . . a gate insulating film, 8 . . . a gate electrode, 9 . . . an interlayer insulating film, 10 . . . a drain electrode, 11 . . . a scanning line, 12 . . . a source electrode, 13 . . . a pixel electrode, 14 . . . a confining wall, 15 . . . a substrate having a TFT, 16 . . . an ink tank, 17 . . . an ink chamber, 18 . . . an anilox roll, 19 . . . an ink layer, 20 . . . a plate, 21 . . . a plate cylinder, 22 . . . a substrate to be printed, 23 . . . a flat base, 24 . . . a substrate having a TFT, a pixel electrode and a confining wall, 25 . . . an interlayer, 26 . . . an electron injection layer, 100 . . . an organic EL display panel, 200 . . . a relief printing apparatus

DETAILED DESCRIPTION OF THE INVENTION

The embodiments of the present invention are explained in detail below referring to the diagrams. In addition, the same constituent elements have the same identical signs in the embodiments and therefore duplicative explanations between the embodiments are omitted.

Figure 1:
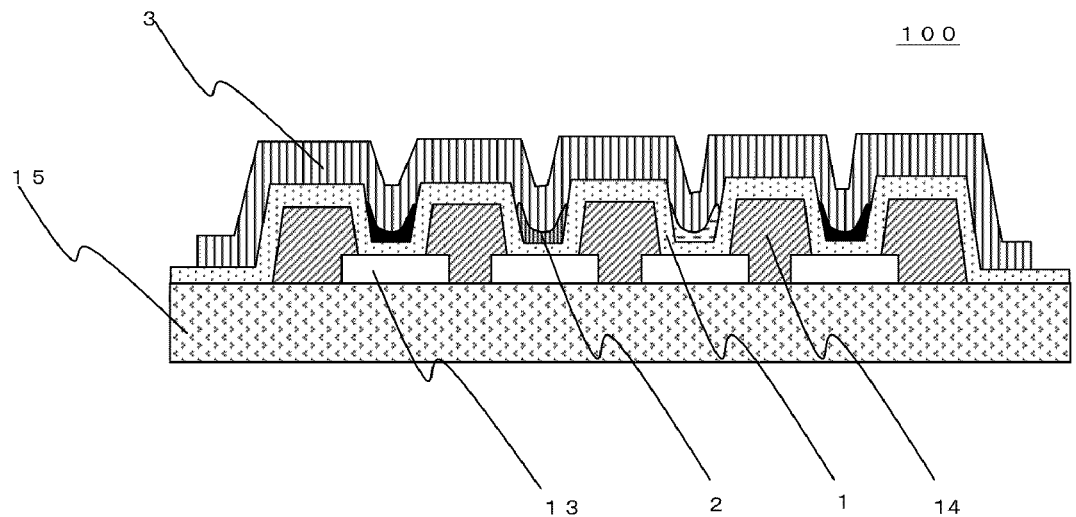
FIG. 1 is a schematic cross-sectional diagram of an organic EL display panel in an embodiment of the present invention.

As shown in FIG. 1, an organic EL display panel 100 in the embodiment of the present invention has a substrate 15 having a thin film transistor (heretofore in some cases referred to as just "TFT"), a pixel electrode 13 having a thin film transistor in each pixel, a confining wall 14 formed by sectioning a pixel electrode 13, a luminescent medium layer formed on the pixel electrode 13 and a counter electrode 3 formed on a luminescent medium layer. Here, a luminescent medium layer includes, for example, a hole transport layer 1, an interlayer (not illustrated) and a luminescent layer 2.

Figure 2:
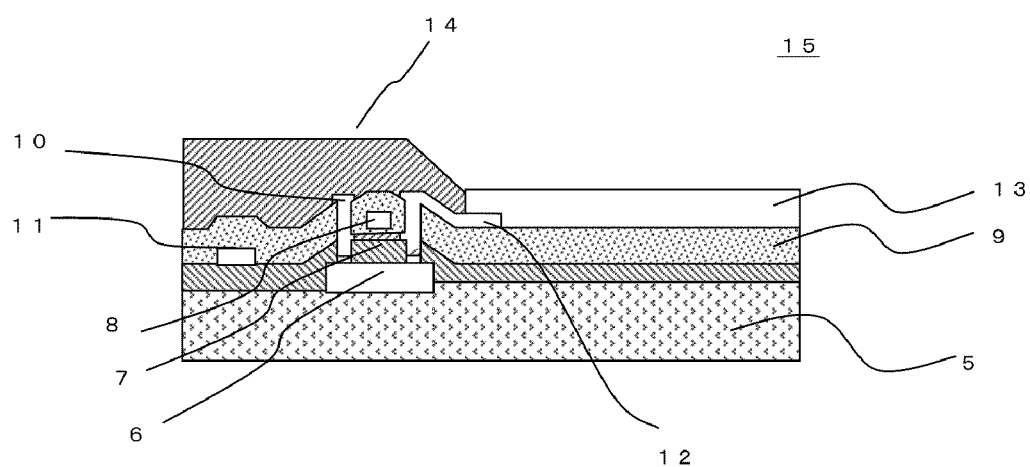
FIG. 2 is a schematic cross-sectional diagram of a substrate having a TFT in an embodiment of the present invention.

As shown in FIG. 2, the substrate 15 having a thin film transistor (TFT) in the embodiment of the present invention has a support medium 5, an active layer 6, a gate electrode 8, a gate insulating film 7, a drain electrode 10, a source electrode 12, an interlayer insulating film 9 and a scanning line 11. Moreover, the substrate 15 having a thin film transistor also has the pixel electrode 13 and the confining wall 14.

A Substrate Having TFT

As shown in FIG. 2, a substrate (a backplane) used for an organic EL display panel 100 in the embodiment of the present invention has a TFT and a pixel electrode 13 (a first electrode) of an organic EL display panel 100. Furthermore, the TFT and the pixel electrode 13 are electrically connected.

The TFT and the organic EL display panel 100 of an active matrix drive type which is formed on the TFT are supported by the support medium 5. For the support medium 5, any material can be used as long as it has a mechanical strength and insulation properties and has excellent dimension stability.

For a material used for the support medium 5, for example, glass or quartz, or a plastic film or sheet such as polypropylene, polyethersulfone, polycarbonate, cyclo olefin polymer, polyarylate, polyamide, polymethylmethacrylate, polyethylene terephthalate and polyethylene naphthalate can be used. In addition, a translucent base material where a film of metallic oxide such as silicium oxide or aluminum oxide, metal fluoride such as aluminum fluoride or magnesium fluoride, metal nitrides such as silicon nitride or aluminum nitride, metal oxynitride such as silicon oxide nitride and polymer resin film such as acryl resin, epoxy resin, silicone resin or polyester resin is formed on a plastic film and sheet can be used. Furthermore, a translucent base material where a plurality of layers of the above are stacked can be used. In addition, as a non-translucent base material, a metal foil, sheet or plate which are made of aluminum, stainless or the like or a layer where a metal film such as aluminum, copper, nickel or stainless is stacked on the plastic film or sheet can be used. However, a usable material is not limited to these in the present invention.

Depending on a direction where light of the organic EL display panel 100 comes out, translucency of the support medium 5 may be selected. In order to avoid entry of moisture to the organic EL display panel 100, exclusion of moisture and hydrophobic treatment are preferably performed by forming an inorganic film or applying fluorine resin on the support medium 5 which has the above mentioned material. In particular, in order to avoid entry of moisture to a luminescent medium layer 25, it is preferable to lower moisture content and the gas transmission coefficient of the support medium 5.

A heretofore known thin film transistor can be used for a thin film transistor arranged on the support medium 5. In particular, mainly a thin film transistor having an active layer 6 in which a source/drain area 10, 12 and channel area are formed, a gate insulating film 7 and a gate electrode 8 can be used. As a structure of the thin film transistor, for example, staggered type, reverse staggered type, top gate type, coplanar type or the like can be used. However, a usable type is not limited to these in particular.

The active layer 6 can be formed by an inorganic semiconductor material such as amorphous silicon, multicrystalline silicon, microcrystal silicon, cadmium selenate or the like or by an organic semiconductor material such as thiophene oligomer, poly(phenylene vinylene) or the like. However, a usable material is not limited to these in particular.

These active layers 6 can be formed by the following methods

1. A method of doping ion after stacking amorphous silicon by plasma CVD.

2. A method having the following process: Amorphous silicon is formed by LPCVD (LOW PRESSURE CHEMICAL VAPOR DEPOSITION) using $SiH_4$ gas. Next, by crystallization of amorphous silicon by a solid phase growth method, polySi is obtained. After this, ion doping is performed by an ion doping method.

3. A low temperature processing method having the following process: Amorphous silicon is formed by LPCVD using $Si_2H_6$ gas or by PECVD (PLASMA ENHANCED CHEMICAL VAPOR DEPOSITION) using $SiH_4$ gas. Amorphous silicon is annealed by lasers such as excimer lasers. Next, a polysilicon is obtained by crystallization of amorphous silicon. After this, ion doping is performed by an ion doping method.

4. A high temperature processing method having the following process: A polysilicon is stacked by low pressure CVD or LPCVD. By performing thermal oxidation on polysilicon at a temperature of 1,000 degrees Celsius or more, the gate insulating film 7 is formed. Thereupon, the gate electrode 8 of n+ polysilicon is formed. Next, ion doping is performed by an ion doping method.

For a gate insulating film 7, a material which is generally used for a gate insulating film 7 can be used. For example, $SiO_2$ formed by PECVD or LPCVD, $SiO_2$ provided by thermal oxidation of a polysilicon film, or the like can be used.

For a gate electrode 8, a material which is generally used for a gate electrode 8 can be used. For example, metals such as aluminum, copper or the like, a refractory metal such as titanium, tantalum or tungsten, polysilicon, silicide of a refractory metal, or polycide can be used. However, a usable material is not limited to these materials in the present invention.

A thin film transistor may have a single gate structure, a double gate structure or a multiple gate structure having three or more gate electrodes. In addition, even an LDD structure and an offset structure can be used. Furthermore, two or more thin film transistors may be arranged on one pixel.

It is necessary for a thin film transistor to be connected so as to function as a switching element of an organic EL display panel 100 in the present invention. Therefore, the drain electrode 10 of a thin film transistor and the pixel electrode 13 of the organic EL display panel 100 are electrically connected.

A Pixel Electrode

As shown in FIGS. 1 and 2, a film of the pixel electrode 13 which is a first electrode in the embodiment of the present invention is formed on the substrate 15 having a TFT and is patterned as required. In the embodiment of the present invention, the pixel electrode 13 which corresponds to each pixel is obtained by sectioning the pixel electrode by the confining wall 14. For a material of the pixel electrode 13, a metal compound oxide such as ITO (indium tin compound oxide), indium zinc compound oxide, zinc aluminum compound oxide, a metal material such as gold and platinum, and a monolayer or multilayer of a particle dispersion membrane which is made by dispersing particles of the metal compound oxide and the metal material into epoxy resin, acrylic resin or the like can be used.

When the pixel electrode 13 is an anode, it is preferable to select a material which has a high work function such as ITO. In the case of extracting light from the bottom side, what is called a bottom emission type, a material which has translucency is selected preferably. Metal materials such as copper and aluminum can also be arranged as an auxiliary electrode in order to reduce wiring resistance of the pixel electrode 13, as necessary.

For a method of forming the pixel electrode 13, a dry film formation method such as a resistance heating evaporation method, an electron beam evaporation method, a reactive deposition method, an ion plating method and sputtering, a wet film formation method such as a gravure printing method and a screen printing method can be used depending on the material. However, a usable method is not limited to these methods in the present invention.

As a method of patterning the pixel electrode 13, an existing patterning method such as a mask evaporation method, a photolithographic method, a wet etching method and a dry etching method can be used depending on the material and the film formation method. When a product having a TFT is used as a substrate, the product having the TFT should be formed so that pixel electrode 13 is electrically connected to TFT electrodes.

A Confining Wall

As shown in FIGS. 1 and 2, the confining wall 14 is formed so as to section a luminescent area which corresponds to a pixel in the embodiment of the present invention. It is preferable to form the confining wall 14 so as to cover an edge part of the pixel electrode 13 (Refer to FIG. 2). Generally, in a display panel of an active matrix drive type, the pixel electrode 13 is formed corresponding to respective pixels so that respective pixels possess an area as large as possible. Therefore, the most preferable shape of the confining wall 14 which covers an edge part of the pixel electrode 13 is a grid shape.

For a method of forming the confining wall 14, a dry etching method which is performed after forming an inorganic film uniformly on the pixel electrode 13 and performing masking with a resist or a method in which photosensitive resin is stacked on the pixel electrode 13, and the resin is patterned to be a predetermined shape by a photolithographic method can be used. If necessary, after the confining wall 14 is formed, a confining wall can be ink repellent by adding a liquid-repellent to the confining wall 14 or irradiating plasma or UV on the confining wall 14.

A preferable height of the confining wall 14 is equal to or more than 0.1 μm and equal to or less than 10 μm, more preferable it is about 0.5 μm~2 μm. When the height is more than 10 μm, the height interrupts a formation of a counter electrode 3 and sealing. When the height is less than 0.1 μm, the confining wall 14 cannot entirely cover an edge part of the pixel electrode 13. Or, the confining wall 14 is caused to short out and have a mixed color with an adjacent pixel at the time of forming the luminescent medium layer 25.

A Luminescent Medium Layer

As shown in FIG. 1, a luminescent medium layer 4 is formed after the confining wall 14 is formed. In an organic EL display panel in the present invention, a plurality of layers including a luminescent layer is stacked as luminescent medium layers. These luminescent medium layers preferably include a hole transport layer and a luminescent layer. Moreover, other than the above, a charge blocking layer and a charge transport layer may be arranged as luminescent medium layers, if necessary, as layers which function as a charge injection layer. A layer stacked between a cathode and a luminescent layer may include a hole injection layer, an electron blocking layer and a hole transport layer. A layer stacked between a luminescent layer and an anode may include a hole blocking layer, an electron injection layer and an electron transport layer. A plurality of layers of the above may be stacked or a layer which has two or more functions thereof can be arranged. A method of stacking a charge injection layer, a charge blocking layer and a charge transport layer can be selected appropriately depending on each material as described later. However, in particular, when a material including an inorganic material is selected, a more stable organic EL display panel which has excellent thermal stability and thermal tolerance can be obtained.

Figure 3:
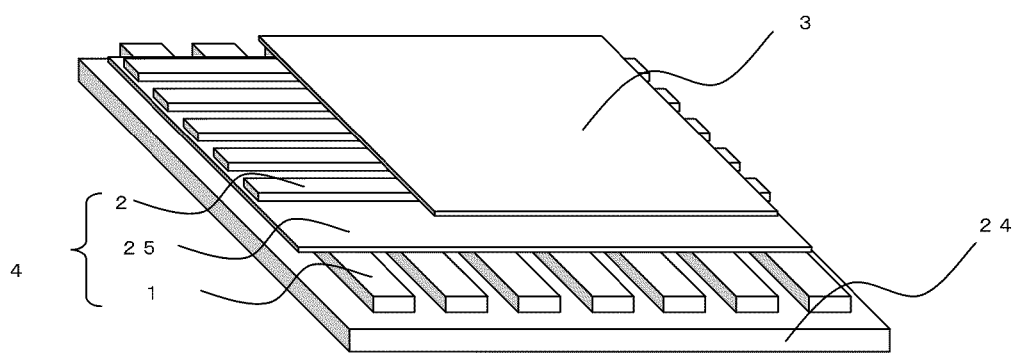
FIG. 3 is a schematic perspective view of an organic EL display panel in an embodiment of the present invention.
Figure 4:
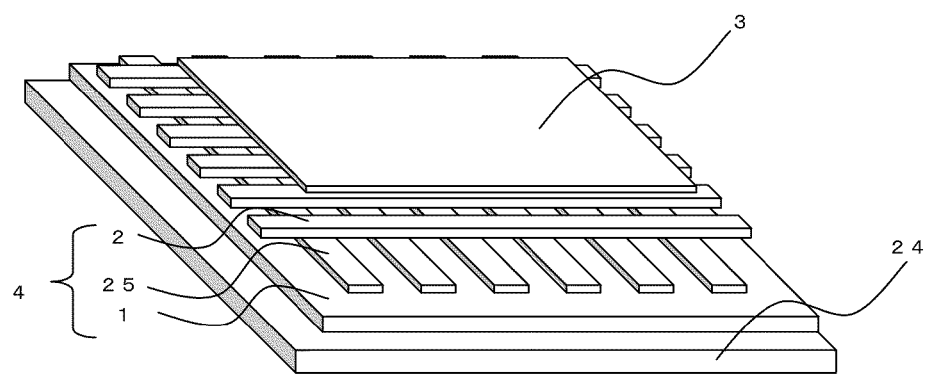
FIG. 4 is a schematic perspective view of an organic EL display panel in an embodiment of the present invention.

FIGS. 3 and 4 show examples of a structure of a stacked luminescent medium layer in the present invention. The characteristics of the present invention are that at least two layers of luminescent medium layers are formed into stripes and the two stripe shaped layers are perpendicular to each other. In FIG. 3, a hole transport layer 1 and a luminescent layer 2 are formed into stripes and are perpendicular to each other. In FIG. 4, an interlayer 25 and a luminescent layer 2 are formed into stripes and are perpendicular to each other. The layers which are perpendicular to each other may sandwich another luminescent layer as shown in FIG. 3, or may be adjacent to each other, as shown in FIG. 4.

A width of the above stripes is more than a longitudinal width and a lateral width of a pixel. When a stripe does not overlap with an adjacent stripe, a leak between adjacent pixels can be prevented. In addition, the case where a width of the above stripes corresponds to a pixel width is preferable, because at this time, the two layers which are perpendicular to each other overlap only on a pixel part. Therefore, because one or more of a luminescent layer or another layer is lacking among pixels which are adjacent to one another, the parts where one or more of a layer is lacking do not emit light or a luminescent efficiency and an electrical conductivity of the parts are low compared to those of the pixels. Then, an electrical current leak to adjacent pixels and a space between pixels which do not essentially emit light is reduced. Therefore a crosstalk can be prevented.

Moreover, luminescent layers of the same colors are formed in respective lines, when one of the luminescent medium layers which are a stripe shape is a luminescent layer. Therefore, for example, a full-colored organic EL display panel in which three colors of R, G and B are arranged so as to be respectively parallel to one another can be manufactured. In particular, when a luminescent medium layer is formed by a printing method such as a relief printing method, an offset printing method or the like with an ink made of a material, an ink supply becomes stable by forming the luminescent medium layer into a stripe shape. Therefore, a uniform luminescent medium layer can be formed.

In terms of decrease in an electrical current leak, it is efficient to apply the present invention to a luminescent medium layer which is a cause of an electrical current leak. Therefore, an electrical current leak can be efficiently decreased by forming a layer in which there are significant electrical current leaks such as a charge transport layer, a charge injection layer and a charge blocking layer into a stripe shape, compared with the case in which the above mentioned layer is formed on the entire surface of luminescent areas.

In particular, by forming a layer having electron transport characteristics which is stacked between a luminescent layer and an anode and a layer having hole transport characteristics which is stacked between a luminescent layer located on the opposite side and a cathode into a stripe shape so as to be respectively perpendicular to each other, conduction outside of an overlapped area is decreased and an electrical current leak can be efficiently decreased. For example, layers such as a hole blocking layer and an electron injection layer, a hole transport layer and an electron transport layer or a hole transport layer and an electron blocking layer can be perpendicular to each other.

A Hole Transport Layer

For a hole transport material for a hole transport layer 1, polyaniline derivative, polythiophene derivative, polyvinyl carbazole (PVK) derivative, poly(3,4-ethylenedioxythiophene) (PEDOT) or the like can be used. However, a usable material is not limited to these in the present invention. These materials may be dissolved or dispersed in a solvent and applied to the entire surface of a substrate (in a lump) as shown in FIG. 4 using spin coating, projection coating or dip coating. In addition, a line pattern which is uniform without defect in a film formation can be obtained in a pixel pitch by using a relief printing method.

In addition, when an inorganic material is used as a hole transport material, as an inorganic material, oxide, nitride and oxynitride of chrome (Cr), tungsten (W), vanadium (V), niobium (Nb), tantalum (Ta), molybdenum (Mo), titanium (Ti), zirconium (Zr), hafnium (Hf), scandium (Sc), yttrium (Y), manganese (Mn), iron (Fe), ruthenium (Ru), osmium (Os), cobalt (Co), nickel (Ni), copper (Cu), zinc (Zn) and cadmium (Cd) can be formed by using a vacuum evaporation method. At this time, by using an arbitrary shadow mask, it becomes possible to form a hole transport layer on the entire surface of a substrate (lump formation) as shown in FIG. 4 or a line pattern thereof can be obtained. By arranging a hole transport layer made of an inorganic material, a more stable organic EL display panel which has excellent thermal stability and thermal tolerance can be obtained.

An Interlayer

A Hole Injection Layer and an Electron Blocking Layer

An interlayer which has a function of injecting a hole and blocking an electron can be formed after a hole transport layer is formed. As mentioned above, a hole injection layer and an electron blocking layer can be formed between a cathode (a pixel electrode) and a luminescent layer. However, these are called "an interlayer" as a whole. A material which is used for an interlayer is polyvinyl carbazole, polyvinylcarbazole derivative or polymers having aromatic amine such as polyarylene derivative, aryl amine derivative and triphenyl diamine derivative. The above mentioned three derivatives have aromatic amine in a main chain or a side chain. However, a usable material is not limited to these materials in the present invention.

A material used for an interlayer is dissolved or dispersed in a solvent and after that, an interlayer is formed by respective kinds of application methods using a spin coater or the like, a printing method such as a relief printing method, a gravure printing method and a screen printing method.

Moreover, when an inorganic material is used as a material for an interlayer, as an inorganic material, oxide, nitride and oxynitride of chrome (Cr), tungsten (W), vanadium (V), niobium (Nb), tantalum (Ta), molybdenum (Mo), titanium (Ti), zirconium (Zr), hafnium (Hf), scandium (Sc), yttrium (Y), manganese (Mn), iron (Fe), ruthenium (Ru), osmium (Os), cobalt (Co), nickel (Ni), copper (Cu), zinc (Zn) and cadmium (Cd) can be formed by using a vacuum evaporation method. At this time, by using an arbitrary shadow mask, it becomes possible to form an interlayer above the entire surface of a substrate as shown in FIG. 3 (lump formation) or a line pattern thereof can be obtained. By arranging an interlayer made of an inorganic material, a more stable organic EL display panel which has excellent thermal stability and thermal tolerance can be obtained.

A Luminescent Layer

A luminescent layer 2 is formed after an interlayer is formed. By applying an electrical current to the luminescent layer 2, a luminescent layer emits light. For an organic luminous material which forms the luminescent layer 2, for example, a material in which luminescent color materials such as coumarin system, perylene system, pyran system, anthrone system, porphyrin system, quinacridone system, N,N'-dialkyl-substituted quinacridone system, naphthalimide system, N,N'-diaryl-substituted pyrrolopyrrole system and iridium complexes are dispersed in polymers such as polystyrene, polymethyl methacrylate and polyvinyl carbazole, and a high-molecular material such as polyarylene system, polyarylene vinylene system and polyfluorene system can be used. However, a usable material is not limited to these materials in the present invention.

An organic luminescent ink is made by dissolving or stably dispersing these organic luminous materials in a solvent. As a solvent in which an organic luminous material is dissolved or dispersed, for example, toluene, xylene, acetone, anisole, methyl ethyl ketone, methyl isobutyl ketone, cyclohexanone can be used. The above-mentioned solvent may be used either as a single solvent or as a mixed solvent. Above all, an aromatic organic solvent such as toluene, xylene and anisole is used preferably due to an aspect of solubility of an organic luminous material. In addition, a surface active agent, an antioxidant, a viscosity modifier and an ultraviolet absorber may be added to an organic luminescent ink if necessary.

In addition to the above mentioned high-molecular materials, low-molecular luminous materials such as 9,10-diaryl anthracenes, pyrene, coronene, perylene, rubrene, 1,1,4,4-tetra phenylbutadiene, tris(8-hydroxyquinolonate)aluminum complex, tris(4-methyl-8-hydroxyquinolonate)aluminum complex, bis(8-hydroxyquinolonate)zinc complex, tris(4-methyl-5-trifluoromethyl-8-hydroxyquinolonate)aluminum complex, tris(4-methyl-5-cyano-8-hydroxyquinolonate)aluminum complex, bis(2-methyl-5-trifluoromethyl-8-quinolinolate)[4-(4-cyanophenyl)phenolate]aluminum complex, bis (2-methyl-5-cyano-8-quinolinolate)[4-(4-cyanophenyl) phenolate]aluminum complex, tris(8-quinolinolate) scandium complex, bis[8-(para-tosyl)aminoquinoline]zinc complex and cadmium complex, 1,2,3,4-tetraphenylcyclopentadiene and poly-2,5-diheptyloxi-para-phenylenevinylene can be used.

For a method of forming the organic luminescent layer 2, an existing film formation method, for example, a vacuum evaporation method or a wet coating method such as an ink jet method, a relief printing method, a gravure printing method and a screen method can be used.

A Method of Forming a Luminescent Medium Layer

An existing film formation method can be used for a method of forming each layer of a luminescent medium layer depending on the material as mentioned above. However, in the case that a stripe pattern is formed by an application, a relief printing method is preferably used, because the method has superior accuracy in a pattern formation and evenness of a film thickness. The examples of forming a luminescent layer by a relief printing method are explained below in detail. However, respective layers of other luminescent medium layers can be formed in the same way.

Figure 5:
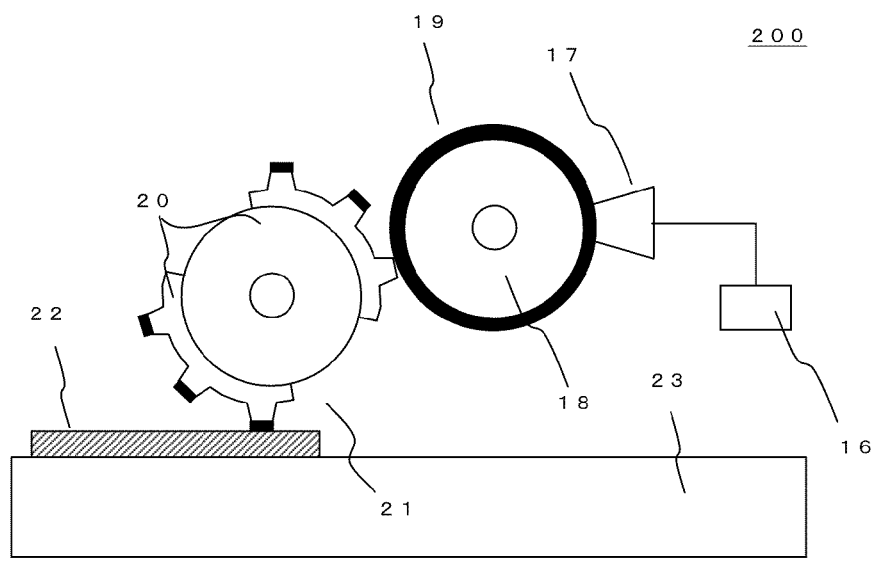
FIG. 5 is a schematic view of a relief printing apparatus of an embodiment of the present invention.

FIG. 5 shows a schematic diagram of a relief printing apparatus 200 which prints an organic luminescent ink made of an organic luminous material so as to obtain a pattern on a substrate to be printed 22 on which an interlayer insulating film 9, a pixel electrode 13, a hole transport layer 1 and an interlayer are formed. The relief printing apparatus 200 in the embodiment of the present invention has an ink tank 16, an ink chamber 17, an anilox roll 18 and a plate cylinder 21 on which a plate 20 having a relief is equipped. The ink tank 16 has an organic luminescent ink diluted with a solvent. The organic luminescent ink is sent into the ink chamber 17 from the ink tank 16. The anilox roll 18 makes contact with an ink supply section of the ink chamber 17, and it is rotatably supported.

Along with a rotation of the anilox roll 18, an ink layer 19 of the organic luminescent ink which is provided on a surface of the anilox roll 18 is formed to have a uniform thickness of a film. The ink of the ink layer 19 is transferred to a convex part of the plate 20 arranged on the plate cylinder 21 which is rotationally driven in proximity to the anilox roll 18. A flat base 23 has the substrate to be printed 22 on which the interlayer insulating film 9, the pixel electrode 13, the hole transport layer 1 and the interlayer are formed. The luminescent layer is formed on the substrate to be printed by printing an ink located on a convex part of the plate 20 on the substrate to be printed. At this time, a dry process can be used as necessary.

As shown in FIGS. 3 and 4, a luminescent layer is formed in stripes so as to be perpendicular to the above mentioned hole transport layer, an interlayer, another hole injection layer or an electron blocking layer which is formed in stripes. In this case, the above is made possible by arranging a printing direction of a luminescent layer so that a TFT substrate is turned at an angle of 90° to an installation direction of a substrate on which a film with a stripe pattern has been previously formed.

After a luminescent layer is formed as a layer constituting a luminescent medium layer, a hole blocking layer, an electron transport layer and an electron injection layer can be formed. These functional layers can be selected arbitrarily depending on the size of the organic EL display panel 100 or the like. Moreover, when these functional layers are patterned in a stripe shape, the functional layers are formed so as to be perpendicular to a luminescent layer.

For a hole blocking material and an electron transport material which are used for a hole blocking layer and electron transport layer, a general material which is used as an electron transport material can be used. A film can be formed by a vacuum evaporation method using a low-molecular material such as triazole, oxazole, oxadiazole, silole or boron. Moreover, the film can be formed with an electron injection ink by a printing method. The electron injection ink can be prepared by dissolving these electron transport materials in a high-molecular such as polystyrene, polymethylmethacrylate or polyvinylcarbazole, and dissolving or dispersing the above mentioned dissolved materials or the electron transport materials in a single or a mixed solvent such as toluene, xylene, acetone, methyl ethyl ketone, methyl isobutyl ketone, cyclohexanone, methanol, ethanol, isopropyl alcohol, ethyl acetate, butyl acetate or water.

An electron injection material used for an electron injection layer can be formed by a salt or oxide of an alkali metal or alkaline earth metal such as lithium fluoride or lithium oxide with vacuum evaporation in addition to the aforementioned material which is used for an electron transport layer. Moreover, the film can be formed with an electron injection ink by a printing method. The electron injection ink can be prepared by dissolving these electron injection materials in a high-molecular such as polystyrene, polymethylmethacrylate or polyvinylcarbazole, and dissolving or dispersing the above mentioned dissolved materials or the electron transport materials in a single or a mixed solvent such as toluene, xylene, acetone, methyl ethyl ketone, methyl isobutyl ketone, cyclohexanone, methanol, ethanol, isopropyl alcohol, ethyl acetate, butyl acetate or water.

A luminescent medium layer is formed only in pixels, because a luminescent medium layer formed as described above is formed into a stripe shape in which at least two layers constituting luminescent medium layers are perpendicular to each other. Therefore, because one or more of a luminescent layer or another layer is lacking among pixels which are adjacent to one another, the parts where one or more layers is lacking do not emit light or a luminescent efficiency and an electrical conductivity of the parts are low compared to those of pixels. Then, an electrical current leak to adjacent pixels and a space between pixels which essentially do not emit light is reduced. Therefore a crosstalk can be prevented.

A Counter Electrode

Next, a counter electrode 3 which is a second electrode is formed (refer to FIG. 1). In the case where the counter electrode 3 in the embodiment of the present invention is a cathode, a substance which has a low work function and a high efficiency of injecting electrons into a luminescent layer 2 can be used. In particular, metal simple substances such as Mg, Al, Yb or the like can be used. Moreover, a stacked film including the film of Al or Cu which has a high stability and electric conductivity and about 1 nm of a film made of an alloy of Li, lithium oxide and LiF as an electron injection layer which is sandwiched between the film of Al or Cu and a luminescent medium layer 4 on an interfacial surface which is connected to a luminescent medium layer 4 can be used. Or in order to have a balance in an electron injecting efficiency and stability, an alloy of one or more of metals such as Li, Mg, Ca, Sr, La, Ce, Er, Eu, Sc, Y and Yb which have a low work function and metal elements such as Ag, Al, Cu or the like which are stable can be used. In particular, an alloy of MgAg, AlLi, CuLi or the like can be used. However, a usable material is not limited to these in the present invention.

A method of forming the counter electrode 3 can be selected from a resistance heating evaporation method, an electron-beam evaporation method, a reactivity evaporation method, an ion plating method and sputtering, depending on a material. However, a method of forming the counter electrode 3 is not limited to these in the present invention.

An organic EL display panel 100 of an active matrix drive type has been explained in the embodiment of the present invention. However, the present invention can also apply to an organic EL display panel of a passive matrix drive type in which the pixel electrode 13 and the counter electrode 3 which sandwich a luminescent medium layer 4 are an anode line and a cathode line which intersect with each other respectively.

A Sealing Body

An organic El display panel 100 emits light by applying electrical current to a luminous material (the luminescent medium layer 4) sandwiched between electrodes (the pixel electrode 13 and the counter electrode 3). However, because an organic luminous material easily deteriorates due to moisture or oxygen in air, generally a sealing body (not illustrated) may be arranged in order to seal an organic luminous material from the outside. A sealing body can be formed, for example, by arranging a resin layer on a sealing material.

A base material is required to have low transmissivity of moisture and oxygen as a sealing material. In addition, as examples of a material, ceramics such as alumina (aluminum oxide), silicon nitride and boron nitride, glass such as no-alkali glass and alkali glass, quartz, and humidity resistance film can be exemplified. However, a usable material is not limited to these materials in the present invention.

As examples of a humidity resistance film, a film which is made by forming SiOx on the both sides of a plastic base material by CVD, a polymeric film to which a film having a low transmissivity and a film having water absorbability or a water absorbent are applied can be exemplified. In addition, moisture vapor transmission rate of the humidity resistance film is preferably equal to or less than $10^{-6}$ g/m²/day.

As examples of a material of a resin layer, the following material can be used. A photo-hardening adhesive property resin, a heat hardening adhesive property resin and two fluid hardening adhesive property resins including an epoxy type resin, acrylic resin, silicone resin or the like, acrylic resin such as ethylene ethylacrylate (EEA) polymer, vinyl resins such as ethylene vinyl acetate (EVA), thermoplastic resin such as polyamide, synthetic rubber, and thermoplasticity adhesive property resins such as acid denatured substances of polyethylen or polypropylene. However, a usable material is not limited to these materials in the present invention.

As examples of a method of forming a resin layer on a sealing material, solvent solution method, pushing out laminate method, fusion/hot melt method, calender method, discharge jet application method, screen printing, vacuum laminate method and heated roll laminate method can be exemplified. A material having hygroscopicity or a property to absorb oxygen can be included in a resin layer if necessary. A thickness of a resin layer formed on a sealing material is selected arbitrarily depending on the size and the shape of an organic EL display panel which is sealed from the outside. However, the thickness is preferably about 5 µm~500 µm. A resin layer is formed on a sealing material here. However, the resin layer can also be formed directly on an organic EL display panel 100 side.

Lastly, in a sealing room, an organic EL display panel 100 is affixed to a sealing body. When a sealing body has a two-layer structure having a sealing material and a resin layer of thermoplastic resin, only pressure bonding is preferably performed by a heated roller When a thermoset adhesive resin is used, after pressure bonding is performed by a heated roller, heat hardening is preferably performed at a hardening temperature. When a photo-hardening adhesive property resin is used, after pressure bonding is performed by a heated roller, hardening can be carried out by additional irradiation with radiation.

According to the present invention, two luminescent medium layers are formed in a stripe shape so as to be perpendicular to each other. Therefore, because the luminescent medium layers are layered only in pixels, an organic El display panel in which a crosstalk can be prevented is obtained while driving voltage is reduced and a luminescent efficiency is improved.

Example 1

As shown in FIG. 2, an active matrix substrate having a thin film transistor and a pixel electrode 13 was used. In this case, the thin film transistor was formed on a support medium 5 as a substrate (a substrate 15 having a TFT) and functioned as a switching element. The size of the substrate was 200 mm×200 mm and a display with a size of 5 inches and the number of pixels of 320*240 was arranged therein in the center of the substrate.

A confining wall 14 was formed with a structure such that the confining wall 14 covered an edge part of the pixel electrode 13 formed on the substrate and sectioned pixels. In addition, the confining wall 14 was formed by the following way. First, a film of a resin with a thickness of 2 nm was formed on the entire surface of a substrate using a positive resist manufactured by ZEON CORPORATION (the name of the product is "ZWD6216-6") by a spin coater method. After that, the confining wall 14 with a width of 40 µm was formed by photolithographic method. In this way, a pixel area was sectioned so that the number of sub pixels was 960×240 dot and the pitch was 0.12 mm×0.36 mm.

A pattern formation of a film of PEDOT with a thickness of 65 nm was carried out in a lump on the pixel electrode 13 as a hole transport layer 1 by a spin coater method.

Thereafter, after the formed substrate was set on the relief printing apparatus 200 as the substrate to be printed 22 as shown in FIG. 5, an interlayer was printed by a relief printing method right above the pixel electrode 13 between confining walls 14 and corresponding to the line pattern of the pixel electrode 13 by using an ink where polyvinyl carbazole derivative which was a material for an interlayer 25 was dissolved in toluene so that concentration of polyvinyl carbazole derivative was 0.5%. In this case, an anilox roll of 300 lines/inch and a photosensitive resin printing plate which was developed by water were used. The film thickness of an interlayer 25 after printing and drying was 10 nm.

After the formed substrate was set on the relief printing apparatus 200 as the substrate to be printed 22 as shown in FIG. 5, a luminescent layer 2 was printed by a relief printing method directly above the pixel electrode 13 between confining walls 14 and corresponding to the line pattern of the pixel electrode 13 by using an organic luminescent ink where polyphenylene vinylene derivative which was an organic luminous material was dissolved in toluene, wherein the concentration of a polyphenylene vinylene derivative was 1%. In this case, a printing direction of the luminescent layer was arranged so that a substrate was turned at an angle of 90° to an installation direction of a substrate on which an interlayer had been previously formed. In this case, an anilox roll of 150 lines/inch and a photosensitive resin printing plate which was developed by water were used. The film thickness of a luminescent layer after printing and drying was 80 nm.

In this way, on the hole transport layer 1 which was formed in a lump as shown in FIG. 4, the luminescent medium layer 4 having an interlayer 25 and the luminescent layer 2 which are stacked as a stripe shape which means the inter layer 25 and the luminescent layer 2 are perpendicular to each other was obtained.

Thereafter, a Ca film was deposited to have a thickness of 20 nm as an electron injection layer on an entire surface of luminescent areas by a vacuum evaporation method using a metal mask. After that, an Al film was deposited to have a thickness of 150 nm as the counter electrode 3 using the same metal mask.

Thereafter, a glass plate as a sealing material was put on the substrate so as to cover the entire luminescent areas, thereafter sealing was performed by hardening an adhesive by heating at about 90 degrees Celsius for one hour. When an active matrix drive type organic EL display panel 100 obtained in this way was driven, it could be driven favorably without a crosstalk.

Example 2

The process shown in Example 1 which had been carried out until the film of the hole transport material of the hole transport layer was formed was used for a process of manufacturing an organic EL display panel. As a hole transport layer, a film of molybdenum oxide was formed to have a thickness of 50 nm in a line pattern which is a stripe shape by a vacuum evaporation method using a shadow mask.

After that, the interlayer 25 was formed on an entire surface of the hole transport layer by a spin coating method. In addition, the luminescent layer 2 was pattern-formed in a stripe shape so as to be perpendicular to the hole transport layer 1 which was formed previously by the same process as Example 1. The luminescent medium layer 4 including the luminescent layer 2 which was formed and patterned in a stripe shape so as to be perpendicular to the hole transport layer 1 which was formed and patterned on lines as shown in FIG. 3 was obtained.

Thereafter, a Ca film was deposited to have a thickness of 20 nm as an electron injection layer on an entire surface of luminescent areas by a vacuum evaporation method using a metal mask. After that, an Al film was deposited to have a thickness of 150 nm as the counter electrode 3 using the same metal mask.

Thereafter, a glass plate as a sealing material was put on the substrate so as to cover the entire luminescent areas, thereafter sealing was performed by hardening an adhesive by heating at about 90 degrees Celsius for one hour. When an active matrix-drive type organic EL display panel 100 obtained in this way was driven, it could be driven favorably without a crosstalk.

Example 3

The process shown in Example 1 which had been carried out until the film of the hole transport material of the hole transport layer was formed was used for a process of manufacturing an organic EL display panel. As a hole transport layer, a film of molybdenum oxide was pattern-formed in a lump to have a thickness of 50 nm by a vacuum evaporation method using a shadow mask.

Thereafter, the interlayer 25 and the luminescent layer 2 were formed and patterned in a stripe shape so as to be perpendicular to each other as shown in FIG. 4 by the same process shown in Example 1.

After that, a Ca film was deposited to have a thickness of 20 nm as an electron injection layer on an entire surface of luminescent areas by a vacuum evaporation method using a metal mask. After that, an Al film was deposited to have a thickness of 150 nm as the counter electrode 3 using the same metal mask.

Thereafter, a glass plate as a sealing material was put on the substrate so as to cover the entire luminescent areas, thereafter sealing was performed by hardening an adhesive by heating at about 90 degrees Celsius for one hour. When an active matrix-drive type organic EL display panel 100 obtained in this way was driven, it could be driven favorably without a crosstalk.

Example 4

Figure 6:
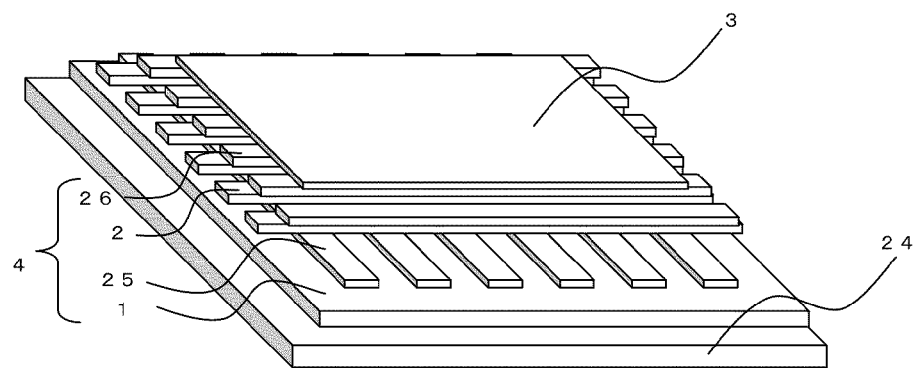
FIG. 6 is a schematic perspective view of an organic EL display panel in an embodiment of the present invention.
Figure 7:
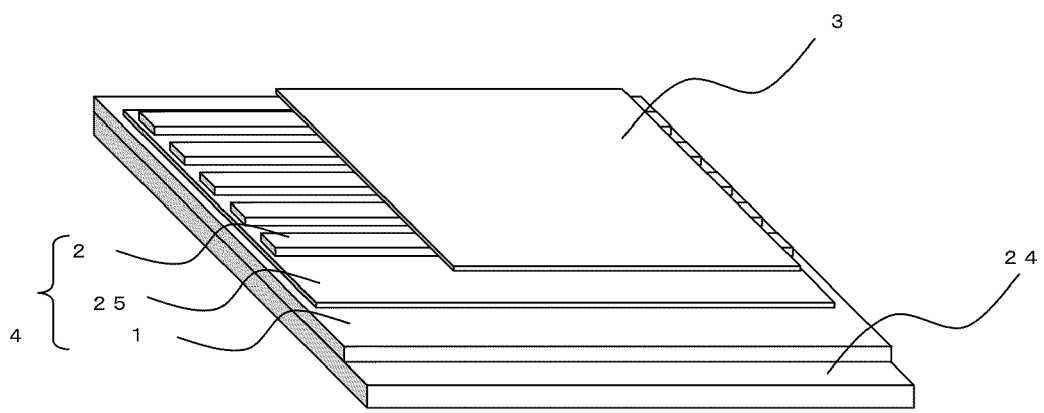
FIG. 7 is a schematic perspective view of a hitherto known organic EL element.

The process shown in example 1 was used until the luminescent layer 2 was formed. Next, a Ca film with a thickness of 20 nm was formed into a stripe shape of a line pattern by a vacuum evaporation method using a shadow mask as an electron injection layer 26 so as to be perpendicular to the interlayer 25 and be parallel to a luminescent layer (Refer to FIG. 6). Thereafter, an Al film with a thickness of 150 nm was formed as the counter electrode 3 using a metal mask on an entire surface of luminescent areas.

After that, a glass plate as a sealing material was put on the substrate so as to cover the entire luminescent areas, thereafter sealing was performed by hardening an adhesive by heating at about 90 degrees Celsius for one hour. When an organic EL display panel of active matrix-drive type 100 obtained in this way was driven, it could be driven favorably without a crosstalk.

Comparative Example 1

An organic EL display panel of an active matrix drive type was formed by the same process shown in Example 1 except for a lump formation of an interlayer by a spin coating method. When the organic EL display panel was driven, confining walls which were not originally intended to emit light emitted light. This meant that the organic EL display panel could not be driven normally.

Comparative Example 2

An organic EL display panel of an active matrix-driven type was formed by the same process as shown in Example 3 except for a lump formation of a hole transport layer by a vacuum evaporation method. When the organic EL display panel was driven, a crosstalk occurred. This meant that the organic EL display panel could not be driven normally.

What is claimed is:

1. An organic EL display panel comprising:
   a plurality of first electrodes formed corresponding to respective pixels;
   a confining wall which covers an edge part of each of said first electrodes and sections said plurality of first electrodes into different pixels;
   a luminescent medium layer having
      a hole transport layer which covers the entire surface of said confining wall and said plurality of first electrodes,
      a plurality of layers which include an interlayer formed on said hole transport layer, and a luminescent layer formed on said interlayer;
   and
   a second electrode formed on said luminescent medium layer,
   wherein said plurality of layers comprising said two layers are formed in stripes and the stripes of one of the two layers are perpendicular to the stripes of the other layer,
   wherein said stripes of one of the two layers is said interlayer,
   and
   wherein said stripes of the other layer is said luminescent layer.

2. The organic EL display panel according to claim 1, wherein said hole transport layer is made of an inorganic material.

3. The organic EL display panel according to claim 2, wherein said interlayer is made of a polymer having an aromatic amine.

4. The organic EL display panel according to claim 1, wherein said luminescent medium layer further comprises an electron injection layer formed on said luminescent layer, and
   wherein said electron injection layer is formed in stripes parallel to the stripes of said luminescent layer.

5. The organic EL display panel according to claim 4, wherein said electron injection layer is made of an inorganic material.

6. The organic EL display panel according to claim 1, wherein a width of said luminescent layer is more than a longitudinal width and a lateral width of said first electrode.

7. The organic EL display panel according to claim 1, wherein said second electrode is formed so as to cover the entire surface of said luminescent layer.

8. The organic EL display panel according to claim 1, wherein said hole transport layer is made of an inorganic material,
   wherein said interlayer is made of a polymer having an aromatic amine,
   wherein said luminescent layer is made of a polymer,
   wherein a width of said luminescent layer is more than a longitudinal width and a lateral width of a pixel,
   wherein said second electrode is formed so as to cover the entire surface of said luminescent layer,
   wherein said luminescent medium layer further comprises an electron injection layer formed on said luminescent layer, and
   wherein said electron injection layer is formed in a stripe shape which is perpendicular to said interlayer and parallel to said luminescent layer.

9. An organic EL display panel comprising:
   a plurality of first electrodes formed corresponding to respective pixels;
   a confining wall which covers an edge part of each of said first electrodes and sections said plurality of first electrodes into different pixels;
   a hole transport layer formed in stripes which covers the entire surface of said plurality of first electrodes and the surface of said confining wall;
   an interlayer which covers the entire surface of said confining wall and said hole transport layer;
   a luminescent layer formed on said interlayer, said luminescent layer formed in stripes;
   and
   a second electrode formed over said luminescent layer,
   wherein the stripes of said luminescent layer are perpendicular to the stripes of said hole transport layer.

10. The organic EL display panel according to claim 9, wherein said hole transport layer is made of a polymer.

11. A method of manufacturing an organic EL display panel according to claim 1, said organic EL display panel comprising:
    a substrate;
    the plurality of first electrodes formed on the substrate;
    a plurality of said confining walls which cover an edge part of each of said first electrodes and section said plurality of first electrodes into different pixels; and
    the luminescent medium layer which has a plurality of layers including the luminescent layer located between said plurality of confining walls on said substrate;
    said method comprising:
    forming a first layer of said luminescent medium layer in stripes on said substrate; and
    forming a second layer of said luminescent medium layer in stripes wherein the stripes of the first layer are perpendicular to the stripes of the second layer.

12. The method of manufacturing an organic EL display panel according to claim 11, wherein at least one of said first layer and second layer is formed by a relief printing method.

13. The method of manufacturing an organic EL display panel according to claim 12, wherein said layer formed in stripes by a relief printing method includes a luminescent layer.

14. The organic EL display panel according to claim 10, wherein said interlayer is made of an inorganic material.

15. The organic EL display panel according to claim 9, further comprising an electron injection layer formed between said luminescent layer and said second electrode,
    wherein said electron injection layer is formed in stripes parallel to the stripes of said luminescent layer.

16. The organic EL display panel according to claim 15, wherein said electron injection layer is made of an inorganic material.

17. The organic EL display panel according to claim 9, wherein a width of said luminescent layer is more than a longitudinal width and a lateral width of said first electrode.

18. The organic EL display panel according to claim 9, wherein said second electrode is formed so as to cover the entire surface of said luminescent layer.

19. The organic EL display panel according to claim 9, wherein said hole transport layer is made of a polymer, wherein said interlayer is made of an inorganic material, wherein said luminescent layer is made of a polymer, wherein a width of said luminescent layer is more than a longitudinal width and a lateral width of a pixel, wherein said second electrode is formed so as to cover the entire surface of said luminescent layer, and additionally comprising an electron injection layer formed on said luminescent layer, and wherein said electron injection layer is formed in a stripe shape which is perpendicular to stripes of said interlayer and parallel to the stripes of said luminescent layer.

* * * * *